United States Patent [19]
Coln et al.

[11] Patent Number: 5,760,617
[45] Date of Patent: Jun. 2, 1998

[54] VOLTAGE-TO-FREQUENCY CONVERTER

[75] Inventors: Michael C. Coln, Lexington; Eric Nestler, Harvard, both of Mass.

[73] Assignee: Analog Devices, Incorporated, Norwood, Mass.

[21] Appl. No.: 700,288

[22] Filed: Aug. 20, 1996

[51] Int. Cl.$^6$ ................................................ H03G 3/06
[52] U.S. Cl. ................................. 327/101; 327/107
[58] Field of Search ................................ 327/101, 105, 327/150, 159

[56] References Cited

U.S. PATENT DOCUMENTS

| | | | |
|---|---|---|---|
| 4,450,532 | 5/1984 | Massey | 327/101 |
| 4,652,832 | 3/1987 | Jasper | 364/721 |
| 4,686,560 | 8/1987 | Balaban et al. | 358/19 |
| 4,835,721 | 5/1989 | Becker et al. | 364/717 |
| 4,991,218 | 2/1991 | Kramer | 381/61 |
| 5,424,664 | 6/1995 | Phillips | 327/106 |
| 5,473,274 | 12/1995 | Reilly et al. | 327/159 |
| 5,596,614 | 1/1997 | Ledda | 375/376 |

*Primary Examiner*—Timothy P. Callahan
*Assistant Examiner*—T. T. Lam

*Attorney, Agent, or Firm*—Fish & Richardson P.C.

[57] ABSTRACT

A voltage-to-frequency converter having an analog-to-digital converter, based on analog components, for converting samples of an analog signal into corresponding digital words and a digital-to-frequency converter, based on digital components, for converting the digital words into a train of pulses having a pulse repetition frequency related to the analog signal. With such an arrangement, the digital-to-frequency converter and the analog-to-digital converter are adapted to operate at different rates. Therefore, the analog-to-digital converter may be optimized at one operating rate while the digital-to-frequency converter is adapted to operate at a higher operating rate and over a wide range of operating rates. This arrangement thereby enables a slower, analog component based, analog-to-digital converter to be used fabricated with CMOS technology along with the higher, variable operating rate, digital component based, digital-to-frequency converter. The digital-to-frequency converter includes a register and an adder for summing the digital words with contents stored in the register to produce a sum thereof. The sum is stored in the register. An interpolator is provided between the analog-to-digital converter and the digital-to-frequency converter for providing digital words for the digital-to-frequency converter at a rate greater than the operating rate of the analog-to-digital converter.

15 Claims, 4 Drawing Sheets

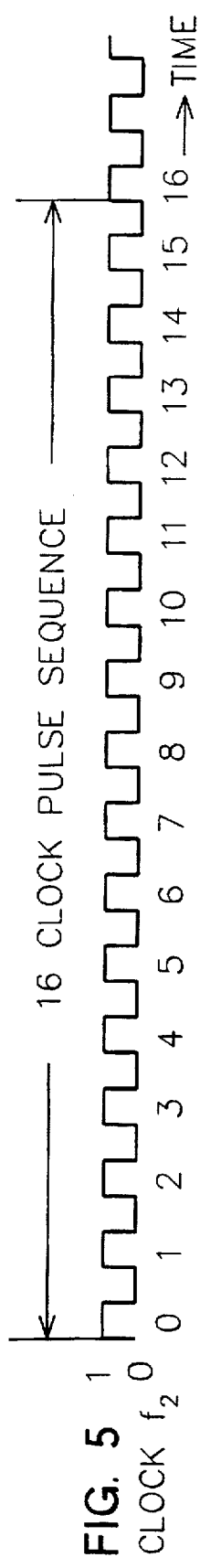
FIG. 5 CLOCK $f_2$
FIG. 6 LINE 38
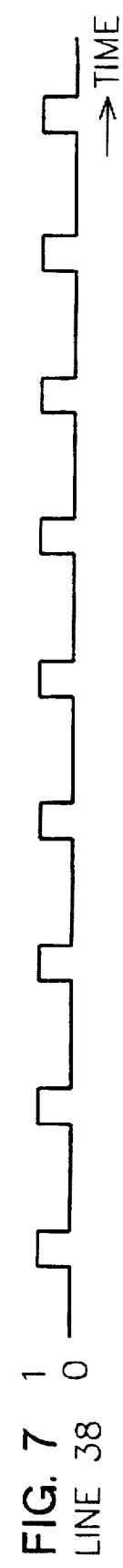
FIG. 7 LINE 38
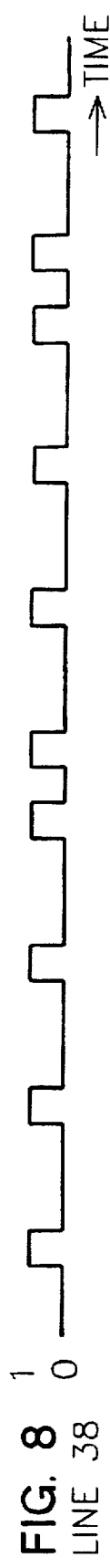
FIG. 8 LINE 38
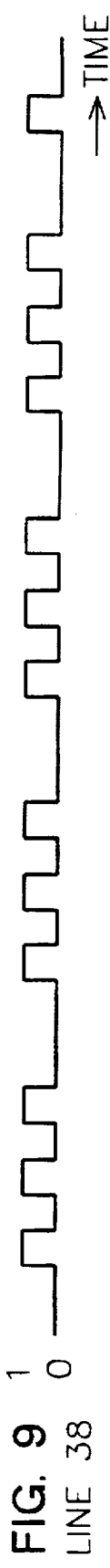
FIG. 9 LINE 38
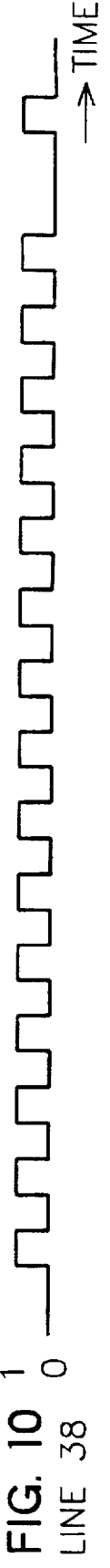
FIG. 10 LINE 38

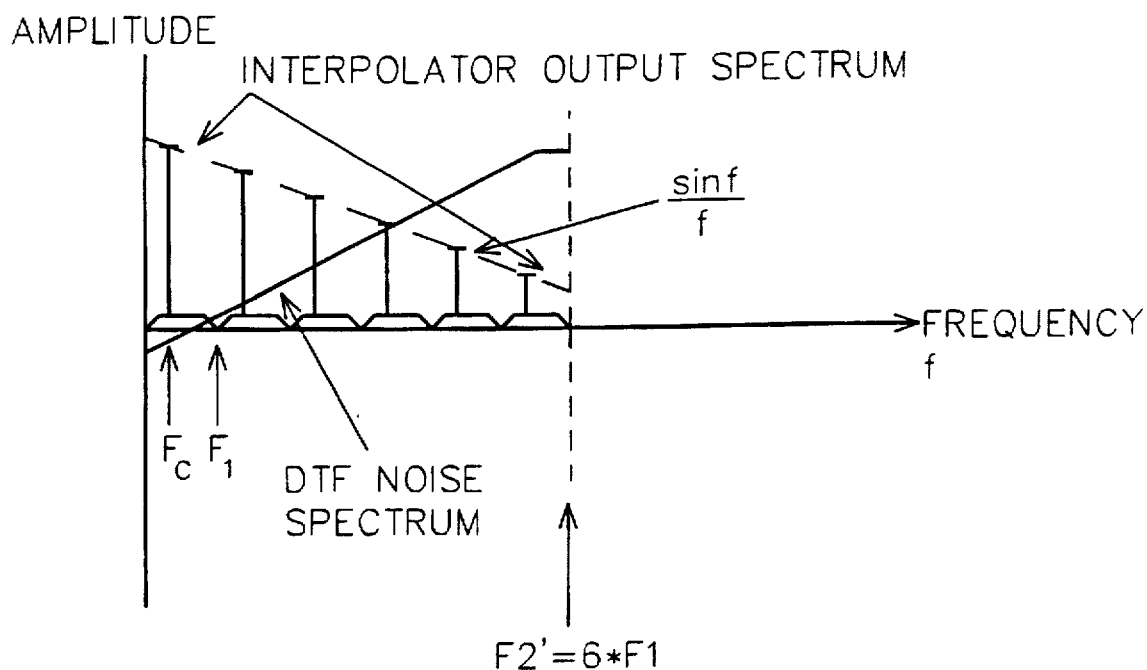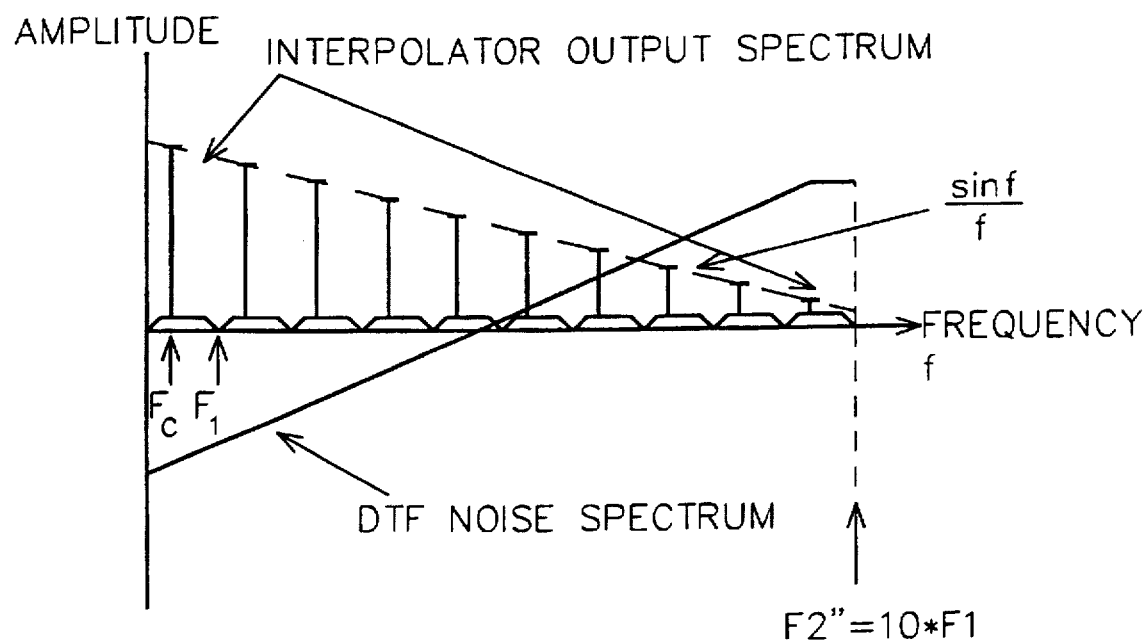
FIG. 11 ing a pulse having a pulse repetition frequency (PRF) of one pulse per each sequence of sixteen clock pulses of FIG. 5 is produced by the voltage-to-frequency converter;

FIG. 7 is a timing history of the carry-out bit produced by an overflow logic coupled to an adder used in the digital-to-frequency converter used in the voltage-to-frequency converter of FIG. 2 which is the output pulse train produced by such voltage-to-frequency converter when a pulse train having a pulse repetition frequency (PRF) of eight pulses per each sequence of sixteen clock pulses of FIG. 5 are produced by the voltage-to-frequency converter;

FIG. 8 is a timing history of the carry-out bit produced by an overflow logic coupled to an adder used in the digital-to-frequency converter used in the voltage-to-frequency converter of FIG. 2 which is the output pulse train produced by such voltage-to-frequency converter when a pulse train

---

VOLTAGE-TO-FREQUENCY CONVERTER

BACKGROUND OF THE INVENTION

This invention relates generally to voltage-to-frequency converters (VFCs) and more particularly to high speed voltage-to-frequency converters adapted to produce a train of pulses having relatively high pulse repetition frequencies (PRFs).

As is known in the art, voltage-to-frequency converters are used in a wide variety of applications to convert the voltage level of an analog input signal into a train of pulses having a pulse repetition frequency (PRF) related to, generally proportional to, such voltage level. Common low-cost voltage-to-frequency converters use analog components predominately. One such voltage-to-frequency converter is shown in FIG. 1 and includes a feedback system 10 fed by the analog input signal, Vin. The feedback system 10 includes an analog integrator 12, a comparator 14 fed by a threshold voltage, VTH, a logic network 16, operative at a rate, F, and an analog switch 18, all arranged as shown. With such an arrangement, a train of pulses, "Frequency out", is produced by the logic network 16 having a PRF proportional to the voltage level of the analog input signal, Vin. With such system, the highest PRF is a function of the operating frequency, F. While such system may be implemented practically with a wide range of fabrication technologies for relatively low operating rates, F, if relatively high PRFs are desired, the fabrication technologies available become, in a practical sense, limited. For example, if it is desired to produce a train of pulses having a maximum PRF of several megahertz (MHz), implementation of the analog components (i.e., integrator 12, comparator 16 and switch 18) in relatively low cost complementary metal oxide silicon (CMOS) technology becomes impractical. Further, if it is desired to change the operating frequency over a wide range of operating frequencies, because of the use of the analog components (i.e., integrator 12, comparator 16 and switch 18), the integrated non-linearly (INL) and differential non-linearity (DNL) transfer function characteristics of the system degrade.

SUMMARY OF THE INVENTION

In accordance with the present invention, a voltage-to-frequency converter is provided having an analog-to-digital converter for converting samples of an analog signal into corresponding digital words and a digital-to-frequency converter for converting the digital words into a train of pulses having a pulse repetition frequency related to the analog signal. With such an arrangement, the digital-to-frequency converter and the analog-to-digital converter are adapted to operate at different rates. Therefore, the analog-to-digital converter, using analog components, is optimized to operate at one operating rate while the digital-to-frequency converter, using digital components, is adapted to operate at a higher operating rate and over a wide range of operating rates. This arrangement thereby enables a slower, analog component based, analog-to-digital converter and the higher, variable operating rate, digital-to-frequency converter to be practically fabricated with CMOS technology.

In accordance with another feature of the invention, the digital-to-frequency converter includes a register and an adder, for summing the digital words with contents stored in the register, to produce a sum thereof. The sum is fed for storage in the register at the operating rate of the digital-to-frequency converter.

In accordance with still another feature of the invention, the contents stored in the register includes N bits, where N is an integer, and the adder produces an output having a first logic state when the sum produced by the adder is less than $2^n$ (where N is an integer greater than, or equal to, n), and produces an output having a complementary logic state when the sum produced by the adder is greater than $2^n$. The register stores the sum when such sum is less than $2^n$ and the register stores the sum minus $2^n$ when the sum is greater than $2^n$. The output of the adder is used to produce the train of pulses.

In accordance with still another feature of the invention, an interpolator is provided between the analog-to-digital converter and the digital-to-frequency converter for producing digital words for the digital-to-frequency converter at a rate greater than the operating rate of the analog-to-digital converter. The interpolator is fed by the digital words at the first rate for interspersing digital words between the digital words produced by the analog-to-digital converter and for producing in accordance therewith digital words at a second rate, such second rate being independent of the first rate.

BRIEF DESCRIPTION OF THE DRAWING

Other features of the invention, as well as the invention itself, will become more readily apparent with reference to the following detailed description taken together with the accompanying drawings, in which:

FIG. 3B showing the output produced by the zero-order interpolator in response to the digital samples; and FIG. 3C showing the output produced by the first-order interpolator in response to the digital samples;

FIG. 5 is a timing history of clock pulses fed to the digital-to-frequency converter used in the voltage-to-frequency converter of FIG. 2;

FIG. 6 is a timing history of a carry-out bit produced by an overflow logic coupled to an adder used in the digital-to-frequency converter used in the voltage-to-frequency converter of FIG. 2 which is the output pulse train produced by such voltage-to-frequency converter when the pulse train having a pulse repetition frequency (PRF) of nine pulses per each sequence of sixteen clock pulses of FIG. 5 are produced by the voltage-to-frequency converter;

FIG. 9 is a timing history of the carry-out bit produced by an overflow logic coupled to an adder used in the digital-to-frequency converter used in the voltage-to-frequency converter of FIG. 2 which is the output pulse train produced by such voltage-to-frequency converter when a pulse train having a pulse repetition frequency (PRF) of twelve pulses per each sequence of sixteen clock pulses of FIG. 5 are produced by the voltage-to-frequency converter;

FIG. 10 is a timing history of the carry-out bit produced by an overflow logic coupled to an adder used in the digital-to-frequency converter used in the voltage-to-frequency converter of FIG. 2 which is the output pulse train produced by such voltage-to-frequency converter when a pulse train having a pulse repetition frequency (PRF) of fifteen pulses per each sequence of sixteen clock pulses of FIG. 5 are produced by the voltage-to-frequency converter; and FIG. 11 is frequency spectra for different interpolation ratios provided by an interpolator used in the analog to frequency converter of FIG. 2.

DESCRIPTION OF THE PREFERRED EMBODIMENTS

Figure 2:
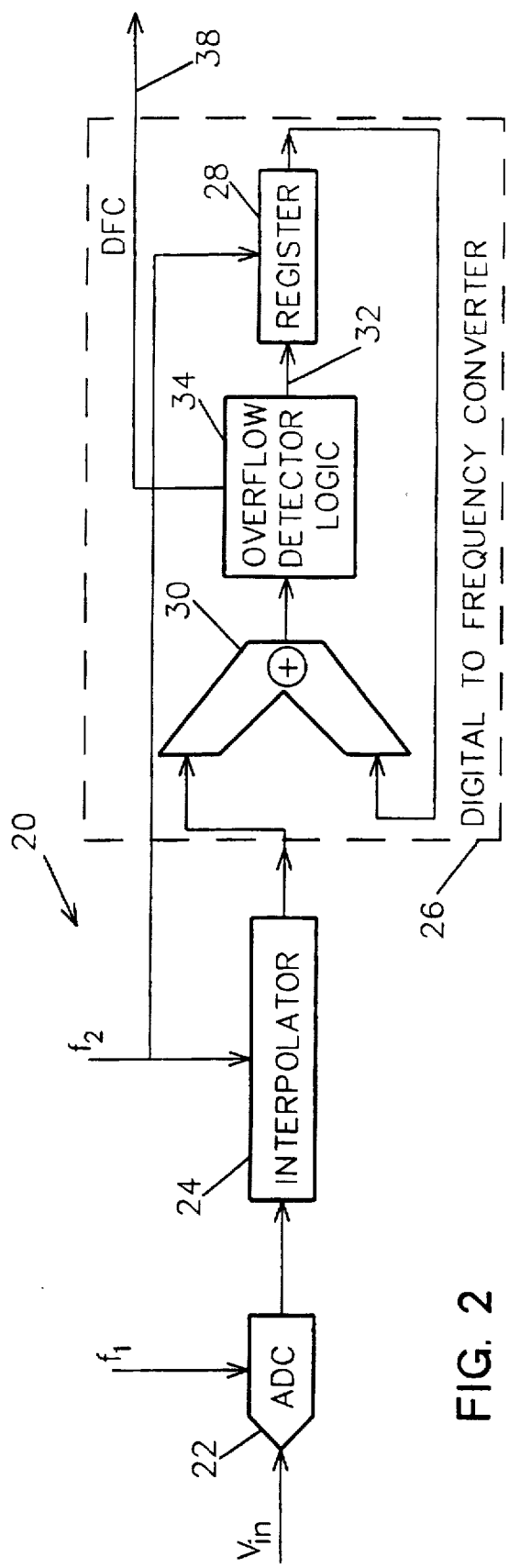
FIG. 2 is a schematic diagram of a voltage-to-frequency converter according to the invention.

Referring now to FIG. 2, a voltage-to-frequency converter 20 is shown. The voltage-to-frequency converter 20 includes: an analog-to-digital converter (ADC) 22 for converting samples of the voltage level of an analog signal, Vin, into corresponding digital words a first rate, $f_1$; an interpolator 24, fed by the digital words produced by the ADC 22 at the first rate, $f_1$, for providing digital words at a second rate, $f_2$, greater than the first rate, $f_1$, such provided digital words being representative of the analog signal; and, a digital-to-frequency converter (DFC) 26 operative at the second rate, $f_2$, for converting the digital words provided by the interpolator 24 at the second rate, $f_2$, into a train of pulses on line 38 having a pulse repetition frequency (PRF) related to the level of the analog signal. The interpolator 24 is fed by the digital words produced by the analog-to-digital converter 22 at the first rate, $f_1$, for interspersing digital words between the digital words produced by the analog-to-digital converter and for producing in accordance therewith digital words at the second rate, $f_2$, such second rate here being an integer multiple, here 32, times the first rate, $f_1$.

The digital-to-frequency converter 26 includes an N-bit, where N is an integer, register 28, for storing data fed thereto from a digital adder 30 at the second rate, $f_2$; the digital adder 30 summing the digital words provided by the interpolator 24 at the second rate, $f_2$, with contents previously stored in the register 28 to thereby provide sums thereof on bus 32 at the second rate, $f_2$, for storage in the register 28. Thus, the arrangement of adder 30 and register 28 may be considered as an integrator, or accumulator; however, as will be described herein after the accumulator is prevented from accumulating a number greater than $2^n$, where n is an integer equal to, or greater than, N.

The digital-to-frequency converter 26 includes an overflow detector logic 34. The adder 30 produces an N bit digital word and the overflow detector logic 34 produces a logic 1 on the carry-out bit line 38 when the input digital produced by the interpolator 24 plus the digital word stored in the register 28 is greater than, or equal to, $2^N$. Thus, the carry-out bit line 38 has a first logic state, here a logic 0, when the sum of the interpolator 24 output and the register 28 output is less than $2^N$ (i.e., when the sum produced by adder 30 is less than $2^N$) and produces an output on the carry-out bit line 38 having a complementary logic state, here logic 1, when the sum produced by the adder 30 is greater than, or equal to, $2^N$. The register 28 stores the sum produced by adder 30 when such sum is less than $2^N$ and the register 28 stores the sum produced by the adder 30 minus $2^N$ when the sum produced by the adder is greater than, or equal to, $2^N$.

Figure 1:
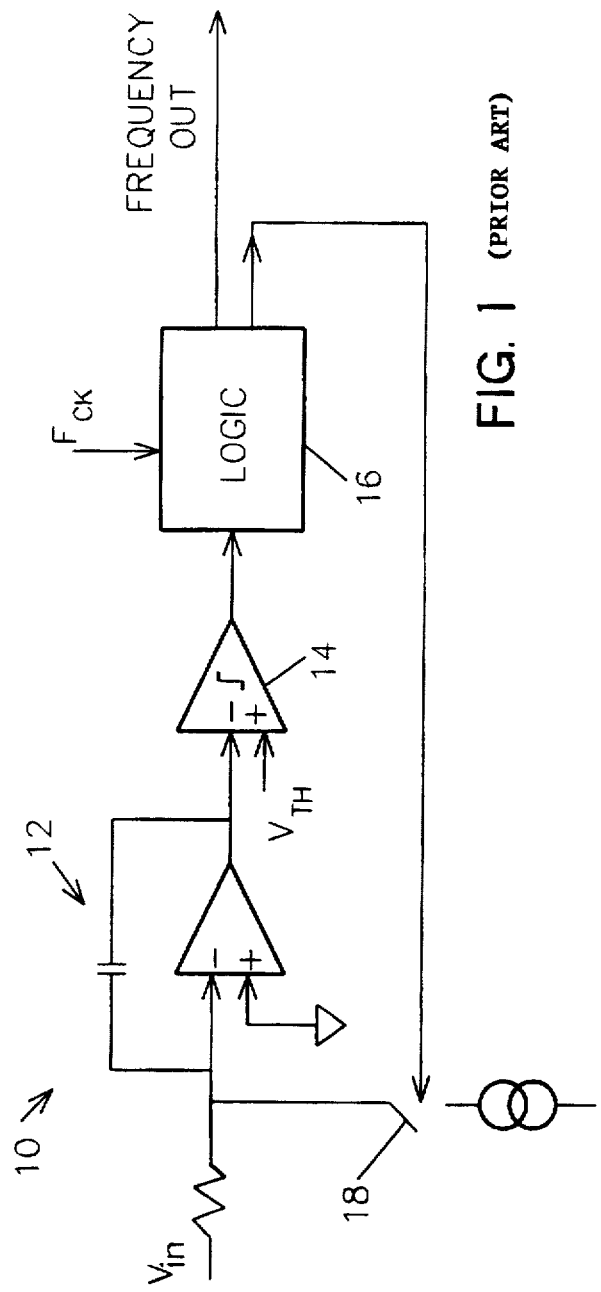
FIG. 1 is a schematic diagram of a voltage-to-frequency converter according to the PRIOR ART.

More particularly, the analog-to-digital converter 22 may be a sigma-delta modulator followed by a digital filter/decimeter for producing digital words at a fixed modulator rate, here that first rate, $f_1$, here, for example, 100 KHz. Alternatively, the analog-to-digital converter 22 may be a successive approximation register (SAR) digital-to-analog converter 22 operating at a fixed conversion rate (i.e., the first rate, $f_1$, here, for example, 100 KHz. In either case, the analog-to-digital converter 22 includes analog components, not shown, such as the analog integrator 12, comparator 14 and analog switch 18, shown in FIG. 1. The design of these analog components is optimized for operation at the conversion rate, i.e., the first rate, $f_1$, here 100 KHz. Thus, the analog-to-digital converter 22 is adapted for fabrication in low cost, CMOS technology.

Figure 3A:
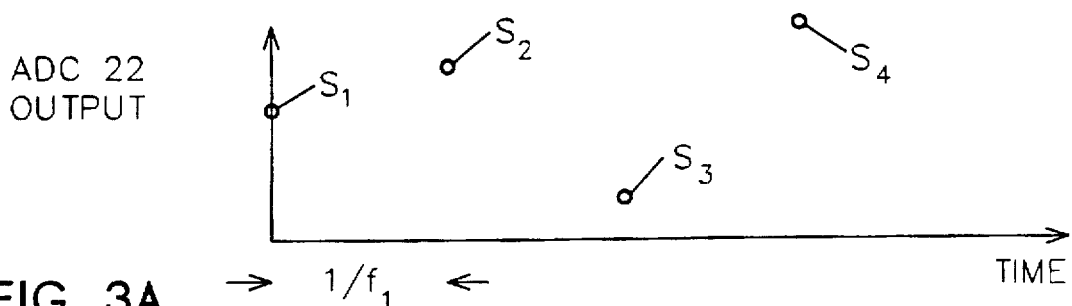
FIGS. 3A through 3C are timing diagrams useful in understanding zero-order and first-order interpolators adapted for use in the voltage-to-frequency converter of FIG. 2, FIG. 3A showing digital samples produced by an analog-to-digital converter used in the voltage-to-frequency converter of FIG. 2.
Figure 3B:
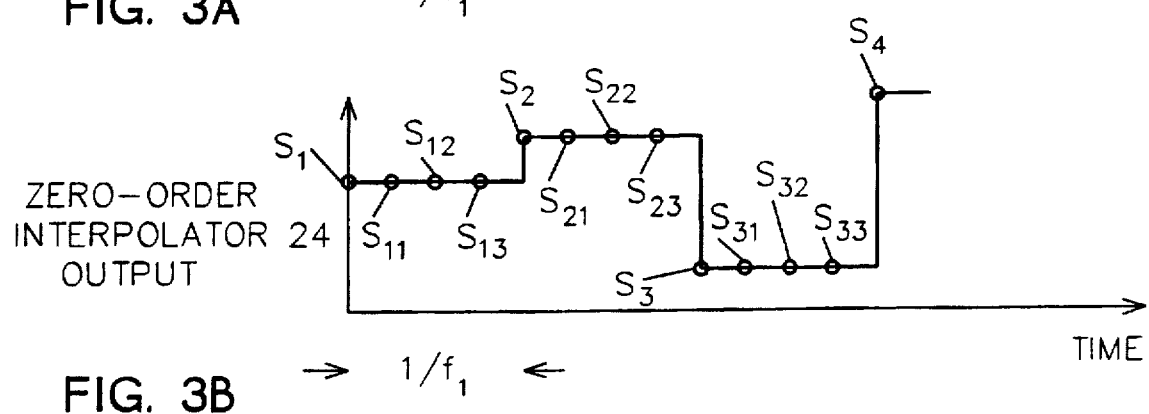

The interpolator 24 up-samples the data word stream produced by the analog-to-digital converter 22 to a higher rate, here the second rate, $f_2$, while retaining the original information. The interpolator 24 separates the output sample rate, $f_1$, of the analog-to-digital converter 22, or data word rate, from the sample rate, $f_2$ of the digital-to-frequency converter 26. The interpolator 24 may be a zero-order interpolator, such as a sample-hold as illustrated in connection with FIGS. 3A and 3B. Thus, as shown in the example of FIG. 3A, digital words $S_1$ through $S_4$ are produced at the first rate $f_1$ by the analog-to-digital converter 22, the zero-order interpolator 24, is clocked at the conversion rate of the digital-to-frequency converter 22 (i.e., the second rate, $f_2$; here, for purposes of illustration in connection with FIGS. 3A through 3C) a rate four times greater than the first rate, $f_1$), to provide, or intersperse, equal samples $S_{11}$, $S_{12}$, $S_{13}$, corresponding to sample $S_1$ between sample $S_1$ and the next sample, $S_2$ produced by the analog-to-digital converter 22; intersperse equal samples $S_{21}$, $S_{22}$, $S_{23}$, corresponding to sample $S_2$ between sample $S_2$ and the next sample, $S_3$ produced by the analog-to-digital converter 22; and, intersperse equal samples $S_{31}$, $S_{32}$, $S_{33}$, corresponding to sample $S_3$, between sample $S_3$ and the next sample, $S_4$ produced by the analog-to-digital converter 22, as shown in FIG. 3B.

Figure 3C:
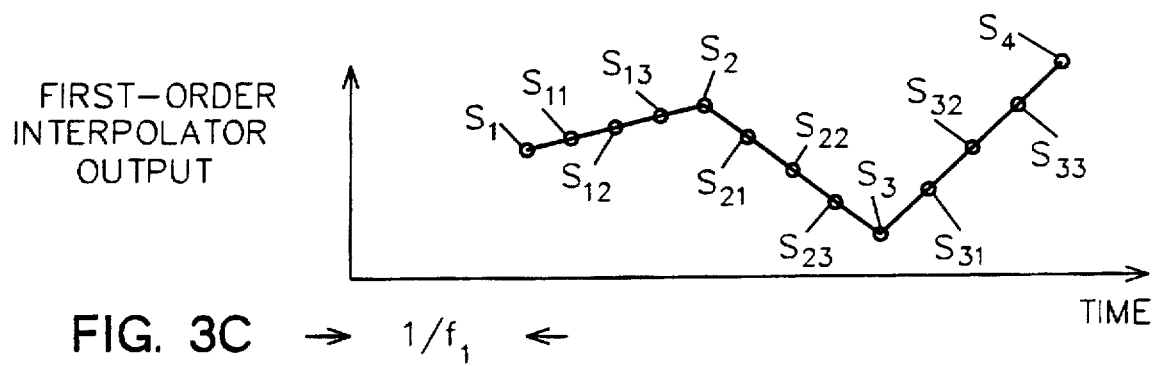
Figure 4:
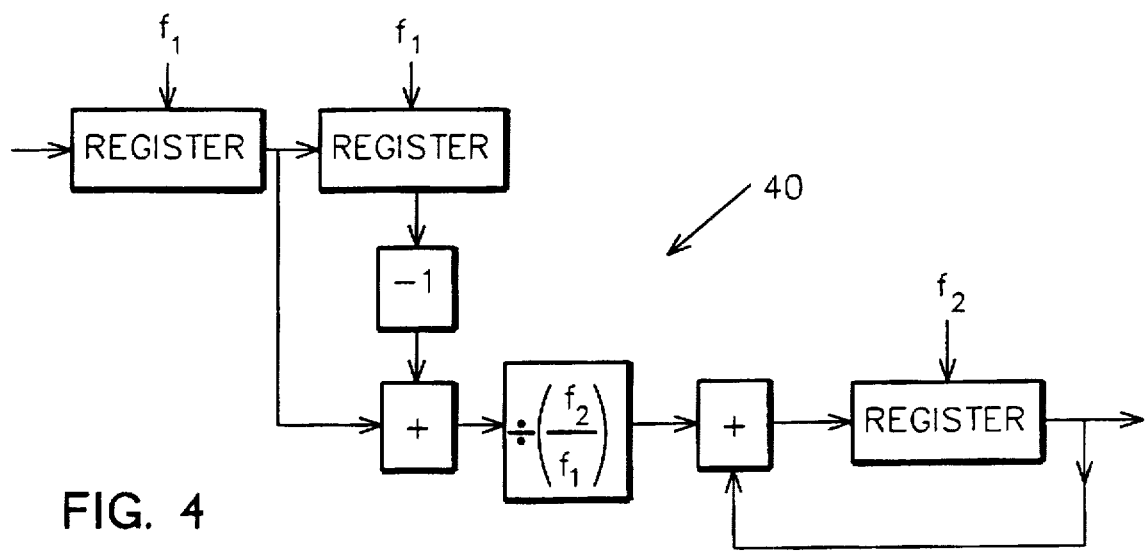
FIG. 4 is a block diagram of a first-order interpolator adapted for use in the voltage-to-frequency converter of FIG. 2 to produce the timing history of FIG. 3C.

It should be noted that higher order interpolators may be used. For example, a first-order interpolator 40, shown in FIG. 4, fed by the samples shown in FIG. 3A produces the output shown in FIG. 3C. The first-order interpolator requires calculation of the slope of the "line" connecting any two adjacent analog-to-digital converter 22 output data words. Thus, referring to FIG. 3C, the first-order interpolator 40 provides samples $S_{11}$, $S_{12}$, $S_{13}$, by interspersing, here linearly interpolating between samples $S_1$ and $S_2$; samples $S_{21}$, $S_{22}$, $S_{23}$, by linearly interpolating between samples $S_2$ and $S_3$; and samples $S_{31}$, $S_{32}$, $S_{33}$, by linearly interpolating between samples $S_3$ and $S_4$, as shown in FIG. 3C. $I_1 = f_2/f_1$, where I is an integer. It is noted that there is a time delay of (1/f) in the output of the interpolator 40. The frequency spectrum of the first-order interpolator 40 has lower harmonic distortion than the zero-order interpolator. The lower level of distortion improves the overall performance. Using higher-order interpolators, however, reduces the harmonic distortion at the expense of more complicated hardware. Higher order interpolators may be implemented by concatenating first-order interpolators together appropriately.

The digital-to-frequency converter 26 converts a value, a digital word in this case, produced by the analog-to-digital converter 22. More specifically, the interpolator 24 in this case, into a train of pulses having a pulse repetition frequency related to, here proportional to, such value. Thus, considering the digital-to-frequency converter 26 shown in FIG. 2, the digital word, or value, provided by interpolator 24 is accumulated, or integrated, in a manner to be described, each time a new value is provided by the interpolator 24, here the second rate, $f_2$. As the integration value increases, (i.e., the sum produced by the adder 30) it eventually reaches some predetermined maximum allowed value, here $2^N$. For this implementation which uses the "carry-out" bit on line 38 of the overflow detector logic 34, the number system of the adder 30 wraps around at the occurrence of the carry-out bit being active also. Thus, in response to clock pulses fed to the register 28 at the second rate $f_2$, here a rate in the range from 1 MHz to 20 MHZ, for each clock pulse, the sum produced by the adder 30, the contents stored in the register 28, and the logic state of the carry-out bit produced on line 38, are shown in TABLE I below for the example where the output of the interpolator 24 is 1 and N=4:

TABLE I

| CLOCK PULSE, $f_2$ | INTERPOL. OUTPUT | REGISTER CONTENTS | SUM | CARRY BIT |
|---|---|---|---|---|
| 0 | 0001 | 0000 | 0001 | 0 |
| 1 | 0001 | 0001 | 0010 | 0 |
| 2 | 0001 | 0010 | 0011 | 0 |
| 3 | 0001 | 0011 | 0100 | 0 |
| 4 | 0001 | 0100 | 0101 | 0 |
| 5 | 0001 | 0101 | 0110 | 0 |
| 6 | 0001 | 0110 | 0111 | 0 |
| 7 | 0001 | 0111 | 1000 | 0 |
| 8 | 0001 | 1000 | 1001 | 0 |
| 9 | 0001 | 1001 | 1010 | 0 |
| 10 | 0001 | 1010 | 1011 | 0 |
| 11 | 0001 | 1011 | 1100 | 0 |
| 12 | 0001 | 1100 | 1101 | 0 |
| 13 | 0001 | 1101 | 1110 | 0 |
| 14 | 0001 | 1110 | 1111 | 0 |
| 15 | 0001 | 1111 | 10000 | 1 |
| 16 | 0001 | 0000 | 0001 | 0 |
| 17 | 0001 | 0001 | 0010 | 0 |
| 18 | 0001 | 0010 | 0011 | 0 |
| 19 | 0001 | 0011 | 0100 | 0 |
| 20 | 0001 | 0100 | 0101 | 0 |
| 21 | 0001 | 0101 | 0110 | 0 |
| 22 | 0001 | 0110 | 0111 | 0 |
| 23 | 0001 | 0111 | 1000 | 0 |
| 24 | 0001 | 1000 | 1001 | 0 |
| 25 | 0001 | 1001 | 1010 | 0 |
| 26 | 0001 | 1010 | 1011 | 0 |
| 27 | 0001 | 1011 | 1100 | 0 |
| 28 | 0001 | 1100 | 1101 | 0 |
| 29 | 0001 | 1101 | 1110 | 0 |
| 30 | 0001 | 1110 | 1111 | 0 |
| 31 | 0001 | 1111 | 10000 | 1 |
| 32 | 0001 | 0000 | 0001 | 0 |

The clock pulses fed to the register 28 and the overflow detector logic 34 at the second rate, $f_2$, is shown in this example, in FIG. 5. The output produced on the carry-out bit line 38 for this example, in shown in FIG. 6. Thus, for the first sequence of 16 clock pulses at $f_2$, there is one pulse produced on line 38. The process repeats for the next sequence of 16 clock pulses at $f_2$. Thus, for this example, a pulse train is produced on line 38 having a pulse repetition frequency (PRF) of one pulse per each sequence of sixteen clock pulses.

Considering an example where the output of the interpolator 24 is 15, the following TABLE II shows the relationship for each clock pulse, between the sum produced by the adder 30, the contents stored in the register 28, and the logic state of the carry-out bit produced by the adder 30 on line 38:

TABLE II

| CLOCK PULSE, $f_2$ | INTERPOL. OUTPUT | REGISTER CONTENTS | SUM | CARRY BIT |
|---|---|---|---|---|
| 0 | 1111 | 0000 | 1111 | 0 |
| 1 | 1111 | 1111 | 1110 | 1 |
| 2 | 1111 | 1110 | 1101 | 1 |
| 3 | 1111 | 1101 | 1100 | 1 |
| 4 | 1111 | 1100 | 1011 | 1 |
| 5 | 1111 | 1011 | 1010 | 1 |
| 6 | 1111 | 1010 | 1001 | 1 |
| 7 | 1111 | 1001 | 1000 | 1 |
| 8 | 1111 | 1000 | 0111 | 1 |
| 9 | 1111 | 0111 | 0110 | 1 |
| 10 | 1111 | 0110 | 0101 | 1 |
| 11 | 1111 | 0101 | 0100 | 1 |
| 12 | 1111 | 0100 | 0011 | 1 |
| 13 | 1111 | 0011 | 0010 | 1 |
| 14 | 1111 | 0010 | 0001 | 1 |
| 15 | 1111 | 0001 | 0000 | 1 |
| 16 | 1111 | 0000 | 1111 | 0 |
| 17 | 1111 | 1111 | 1110 | 1 |
| 18 | 1111 | 1110 | 1101 | 1 |
| 19 | 1111 | 1101 | 1100 | 1 |
| 20 | 1111 | 1100 | 1011 | 1 |
| 21 | 1111 | 1011 | 1010 | 1 |
| 22 | 1111 | 1010 | 1001 | 1 |
| 23 | 1111 | 1001 | 1000 | 1 |
| 24 | 1111 | 1000 | 0111 | 1 |
| 25 | 1111 | 0111 | 0110 | 1 |
| 26 | 1111 | 0110 | 0101 | 1 |
| 27 | 1111 | 0101 | 0100 | 1 |
| 28 | 1111 | 0100 | 0011 | 1 |
| 29 | 1111 | 0011 | 0010 | 1 |
| 30 | 1111 | 0010 | 0001 | 1 |
| 31 | 1111 | 0001 | 0000 | 1 |
| 32 | 1111 | 0000 | 1111 | 0 |
| 33 | 1111 | 1111 | 1110 | 1 |

FIGS. 10A and 10B show the timing histories of the output produced on a carry-out bit line 38 and the output pulse train produced on line 38 when a pulse train having a pulse repetition frequency (PRF) of fifteen pulses per each sequence of sixteen clock pulses are produced by the voltage-to-frequency converter 20.

FIG. 7 shows the timing history of the output produced on a carry-out bit line 38 when a pulse train having a pulse repetition frequency (PRF) of eight pulses per each sequence of sixteen clock pulses are produced by the voltage-to-frequency converter 20. FIG. 8 shows the timing history of the output produced on a carry-out bit line 38 when a pulse train having a pulse repetition frequency (PRF) of nine pulses per each sequence of sixteen clock pulses are produced by the voltage-to-frequency converter 20. FIG. 9 shows the timing history of the output produced on a carry-out bit line 38 when a pulse train having a pulse repetition frequency (PRF) of twelve pulses per each sequence of sixteen clock pulses are produced by the voltage-to-frequency converter 20.

Thus, a train of pulses (i.e., here logic 1 signals) having M logic is for each sequence of 16 clock pulses, where M is the digital word, is produced by the interpolator 24. Thus, with the voltage-to-frequency converter 20 (FIG. 2), the analog input signal bandwidth, and especially the accuracy of the analog-to-digital conversion, becomes independently defined from the output frequency signal representation, i.e., the PRF. As an example, the analog-to-digital conversion can be defined as responding to a 0 Hz to 10 Hz bandwidth while the output maximum frequency can be defined as 1 MHz, 10 MHz, or 20 MHz, independently, and without affecting the ADC behavior. The frequency (PRF) span, or range, of the output signal on line 38 can also be independently defined from the ADC because it is a function of the second rate, $f_2$, in addition to the level of the input signal, Vin. This means that both Fmin (the minimum PRF) and Fmax (the maximum PRF) can be defined independently from the ADC 22 because the ADC 22 and the DFC 26 operate with independent clocks, $f_1$ and $f_2$, respectively. Further, the ADC 22 and DFC 26 can be designed independently of each other because the ADC 22 and the DFC 26 operate with independent clocks, $f_1$ and $f_2$, respectively.

Other embodiments are within the spirit and scope of the appended claims. For example, instead of using a 4 bit adder 30 and using the carry-out bit for line 38, a 6 bit adder may be used. Here, the most significant bit (MSB) is compared with the next to the most significant bit (i.e., MSB-1). If the MSB and (MSB-1) have different logic states a logic one is produced on line 38 (FIG. 2); the (MSB-1) is complemented; and, the register 28 is loaded with zero, or some other number to set Fmin. For example, considering again the example described above in TABLE I using a 6 bit adder, the following TABLE III results:

TABLE III

| CLOCK PULSE, $f_2$ | INTERPOL. OUTPUT | REGISTER CONTENTS | 6 BIT ADDER | LINE 38 |
| --- | --- | --- | --- | --- |
| 0  | 0001 | 0000 | 000001 | 0 |
| 1  | 0001 | 0001 | 000010 | 0 |
| 2  | 0001 | 0010 | 000011 | 0 |
| 3  | 0001 | 0011 | 000100 | 0 |
| 4  | 0001 | 0100 | 000101 | 0 |
| 5  | 0001 | 0101 | 000110 | 0 |
| 6  | 0001 | 0110 | 000111 | 0 |
| 7  | 0001 | 0111 | 001000 | 0 |
| 8  | 0001 | 1000 | 001001 | 0 |
| 9  | 0001 | 1001 | 001010 | 0 |
| 10 | 0001 | 1010 | 001011 | 0 |
| 11 | 0001 | 1011 | 001100 | 0 |
| 12 | 0001 | 1100 | 001101 | 0 |
| 13 | 0001 | 1101 | 001110 | 0 |
| 14 | 0001 | 1110 | 001111 | 0 |
| 15 | 0001 | 1111 | 010000 | 1 |
| 16 | 0001 | 0000 | 000001 | 0 |
| 17 | 0001 | 0001 | 000010 | 0 |
| 18 | 0001 | 0010 | 000011 | 0 |
| 19 | 0001 | 0011 | 000100 | 0 |
| 20 | 0001 | 0100 | 000101 | 0 |
| 21 | 0001 | 0101 | 000110 | 0 |
| 22 | 0001 | 0110 | 000111 | 0 |
| 23 | 0001 | 0111 | 001000 | 0 |
| 24 | 0001 | 1000 | 001001 | 0 |
| 25 | 0001 | 1001 | 001010 | 0 |
| 26 | 0001 | 1010 | 001011 | 0 |
| 27 | 0001 | 1011 | 001100 | 0 |
| 28 | 0001 | 1100 | 001101 | 0 |
| 29 | 0001 | 1101 | 001110 | 0 |
| 30 | 0001 | 1110 | 001111 | 0 |
| 31 | 0001 | 1111 | 010000 | 1 |
| 32 | 0001 | 0000 | 000001 | 0 |

Thus, from the above, when the frequencies $f_1$, $f_2$ are separated by the interpolator 24, the ADC can operate at a lower fixed frequency, which makes it easier to design. Further, considering to frequency domain and referring to FIG. 11, the output signal-plus-noise spectra at the input and output nodes of the digital to frequency converter 26 is shown. This would also be the frequency spectra at the output of the interpolator 24 and the output of the digital to frequency converter 26. The spectra is for a zero-order interpolator of the ADC 20 output at rate $f_1$ up to an $f_2$ rate.

For a fixed ADC rate, the $f'_2$ is the digital to frequency converter 26 output with an interpolation ratio of 6 and $f''_2$ is for an interpolation ratio of 10. The ADC output spectrum from 0 Hz to $f_1$ Hz includes low level noise plus the single frequency signal, $f_c$. This spectrum is replicated m-times by the zero-order interpolation. In effect, the digital to frequency converter 26 spectrum can be slid up and down the frequency spectrum while the ADC output spectrum remains constant. The number of images would change depending on the interpolation ratio used in the configuration. Thus, the interpolator 24 enabled design decoupling between the ADC rate $f_1$ and the digital to frequency converter rate $f_2$.

What is claimed is:

1. A voltage-to-frequency converter, comprising:
   an analog-to-digital converter for converting samples of an analog signal into corresponding digital words;
   a digital-to-frequency converter for converting the digital words into a train of pulses having a pulse repetition frequency related to the analog signal.

2. A voltage-to-frequency converter, comprising:
   an analog-to-digital converter for converting samples of an analog signal level into corresponding digital words;
   a digital-to-frequency converter for converting the digital words into a train of pulses having a pulse repetition frequency related to the level of the analog signal.

3. The voltage-to-frequency converter recited in claim 2 wherein the digital-to-frequency converter operates at a first rate and the analog-to-digital converter operates at a second rate different from the first rate.

4. The voltage-to-frequency converter recited in claim 3 wherein the digital-to-frequency converter comprises:
   a register;
   an adder for summing the digital words with contents stored in the register to produce a sum thereof, such sum being stored in the register at the second rate.

5. The voltage-to-frequency converter recited in claim 4 wherein the digital-to-frequency converter includes an overflow detection logic fed by the adder, such logic being operative at the operating rate of the digital-to-frequency converter, an output of the logic being fed to the register.

6. The voltage-to-frequency converter recited in claim 5 wherein the contents produced by the adder includes N bits where N is an integer, and wherein the adder produces an output having a first logic state when the sum produced by the adder is less than $2^N$ and produces an output having a complementary logic state when the sum produced by the adder is greater than, or equal to $2^N$, the register storing the sum when such sum is less than $2^N$ and the register storing the sum minus $2^N$ when the sum is greater than, or equal to, $2^N$.

7. A voltage-to-frequency converter, comprising:
   an analog-to-digital converter for converting samples of an analog signal into corresponding digital words a first rate;
   an interpolator, fed by the digital words at the first rate for interspersing digital words between the digital words produced by the analog-to-digital converter and for producing in accordance therewith digital words at a second rate, such second rate being independent of the first rate;
   a digital-to-frequency converter for converting, at the second rate, the digital words provided by the interpolator into a train of pulses having a pulse repetition frequency related to the analog signal.

8. A voltage-to-frequency converter, comprising:
   an analog-to-digital converter for converting samples of an analog signal level into corresponding digital words at first rate;

an interpolator, fed by the digital words at the first rate for providing digital words at a second rate greater than the first rate, such provided digital words being representative of the analog signal;

a digital-to-frequency converter for converting the digital words provided by the interpolator at the second rate into a train of pulses having a pulse repetition frequency related to the level of the analog signal.

9. The voltage-to-frequency converter recited in claim 8 wherein the digital-to-frequency converter operates at the second rate to produce the train of pulses.

10. The voltage-to-frequency converter recited in claim 9 wherein the digital-to-frequency converter comprises:

a register;

an adder for summing the digital words provided by the interpolator with contents stored in the register to produce a sum thereof, such sum being stored in the register at the second rate.

11. The voltage-to-frequency converter recited in claim 10 wherein the digital-to-frequency converter includes an overflow logic fed by the adder such logic being operative at the second rate to produce the train of pulses, an output of the logic being fed to the register.

12. The voltage-to-frequency converter recited in claim 10 wherein the contents produced by the adder includes N bits, where N is an integer, and wherein the adder produces an output having a first logic state when the sum produced by the adder is less than $2^N$ and produces an output having a complementary logic state when the sum produced by the adder is greater than, or equal to, $2^N$, the register storing the sum when such sum is less than $2^N$ and the register storing the sum minus $2^N$ when the sum is greater than, or equal to, $2^N$.

13. A voltage-to-frequency converter, comprising:

an analog-to-digital converter for converting samples of an analog signal into corresponding digital words;

a digital-to-frequency converter for converting the digital words into a train of pulses having a pulse repetition frequency directly related to the digital words.

14. The voltage-to-frequency converter recited in claim 13 wherein the digital-to-frequency converter and the analog-to-digital converter operate at different rates.

15. A voltage-to-frequency converter, comprising:

an analog-to-digital converter for converting samples of levels of an analog signal into corresponding digital words;

a digital-to-frequency converter for converting each one of the digital words into a train of pulse having a pulse repetition frequency directly related to such one of the digital words.

* * * * *